(12) United States Patent
O'Dwyer

(10) Patent No.: US 8,013,764 B1
(45) Date of Patent: Sep. 6, 2011

(54) METHOD AND APPARATUS FOR SHIFTING THE BITS OF A WIDE DATA WORD

(75) Inventor: John G. O'Dwyer, Maynooth (IE)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/693,648

(22) Filed: Jan. 26, 2010

Related U.S. Application Data

(60) Provisional application No. 61/148,929, filed on Jan. 31, 2009.

(51) Int. Cl.
*H03M 9/00* (2006.01)
(52) U.S. Cl. .......................................... 341/100; 341/101
(58) Field of Classification Search .................. 341/100, 341/101, 50, 141
See application file for complete search history.

(56) References Cited

U.S. PATENT DOCUMENTS

| | | | | |
|---|---|---|---|---|
| 3,573,799 A | * | 4/1971 | Drinnan et al. | 341/81 |
| 4,346,369 A | * | 8/1982 | Macy | 341/24 |
| 4,903,240 A | * | 2/1990 | Von Flue | 365/189.02 |
| 6,985,096 B1 | * | 1/2006 | Sasaki et al. | 341/100 |
| 7,372,381 B2 | * | 5/2008 | Chan | 341/100 |
| 2009/0182912 A1 | * | 7/2009 | Yoo et al. | 710/71 |

OTHER PUBLICATIONS

U.S. Appl. No. 61/148,929, filed Jan. 31, 2009, O'Dwyer et al.
U.S. Appl. No. 12/693,643, filed Jan. 26, 2010, O'Dwyer.
U.S. Appl. No. 12/694,169, filed Jan. 26, 2010, O'Dwyer et al.
Xilinx, Inc., "Dynamic Phase Alignment with ChipSync Technology in Virtex-4 FPGAs," *Xcell Journal* Apr. 2005, pp. 72-74, Issue 52, Xilinx, Inc., San Jose, California, USA.
Xilinx, Inc., *16-Channel, DDR LVDS Interface with Real-Time Window Monitoring*, App. Note XAPP860 (v1.1), Jul. 17, 2008, pp. 1-43, Xilinx, Inc., San Jose, California, USA.

* cited by examiner

*Primary Examiner* — Peguy Jean Pierre
(74) *Attorney, Agent, or Firm* — Kin-Wah Tong

(57) ABSTRACT

In one embodiment, a method and apparatus for shifting the bits of a data word are disclosed. For example, a deserializer according to one embodiment includes an input register bank for capturing serial data comprising n bits, an intermediate register bank, and a strobe mux coupled to an input of the intermediate register bank. An input of the intermediate register bank is coupled to an output of the input register bank. The strobe mux comprises a single multiplexer configured to select a bitslip strobe signal that controls an order in which the n bits of the serial data are captured in the intermediate register bank.

19 Claims, 5 Drawing Sheets

METHOD AND APPARATUS FOR SHIFTING THE BITS OF A WIDE DATA WORD

CROSS REFERENCE TO RELATED APPLICATIONS

This application claims the benefit of U.S. Provisional Patent Application Ser. No. 61/148,929, filed Jan. 31, 2009, which is herein incorporated by reference in its entirety.

FIELD OF THE INVENTION

This invention relates generally to a method and apparatus for shifting the bits of a wide data word recovered from an input deserializer, such that the final output word is aligned correctly from most significant bit to least significant bit.

BACKGROUND

FIG. 1 is a schematic diagram illustrating a conventional eight-bit input deserializer 100. In operation, input data is shifted through the first register bank $102_1$. When the first register bank $102_1$ is full, the input data is captured in parallel in the second register bank $102_2$. The least significant bit or the most significant bit of the input data is not necessarily captured at the top or bottom of the second register bank $102_2$, but could be captured in any of the eight flip flops of the second register bank $102_2$. Thus, a barrel shifter 104 comprising eight eight-to-one multiplexers is positioned between the second register bank $102_2$ and the third register bank $102_3$. The barrel shifter 104 allows any bit from the second register bank $102_2$ to be re-mapped to any input in the third register bank $102_3$. The output bits can therefore be re-ordered as necessary.

Although deserializers such as the deserializer 100 are effective in re-ordering the output bits, they are very difficult to scale. In particular, the faster the input data is, the wider the deserializer needs to be. However, the more bits that are in the register banks 102, the slower the overall circuit will be due to the larger muxing and the increased loading on each register output of the second register bank $102_2$. The only way to make the deserializer 100 operate at speed is to increase the drive strength and reduce the circuit delay by increasing the size of the circuitry. This makes the deserializer 100 impractical for use in small, low-cost integrated circuit (IC) devices such as small field programmable gate arrays (FPGAs).

SUMMARY

In one embodiment, a method and apparatus for shifting the bits of a data word are disclosed. For example, a deserializer according to one embodiment includes an input register bank for capturing serial data comprising n bits, an intermediate register bank, and a strobe mux coupled to an input of the intermediate register bank. An input of the intermediate register bank is coupled to an output of the input register bank. The strobe mux comprises a single multiplexer configured to select a bitslip strobe signal that controls an order in which the n bits of the serial data are captured in the intermediate register bank.

In another embodiment, a method for shifting bits of a data words includes capturing the bits into an input register bank of a deserializer; and shifting the bits from the input register bank to an intermediate register bank. The shifting is performed in accordance with a bitslip strobe signal that controls an order in which the bits are captured in the intermediate register bank.

Also disclosed are non-transitory computer-readable storage media having stored thereon a plurality of instructions, the plurality of instructions including instructions which, when executed by a processor, cause the processor to perform the steps of the methods described herein.

BRIEF DESCRIPTION OF THE DRAWINGS

Accompanying drawings show exemplary embodiments in accordance with one or more aspects of the invention; however, the accompanying drawings should not be taken to limit the invention to the embodiments shown, but are for explanation and understanding only.

DETAILED DESCRIPTION

In one embodiment, the present invention relates generally to a method and apparatus for shifting the bits of a data word, e.g., a wide data word, recovered from an input deserializer, such that the final output word is aligned correctly from most significant bit to least significant bit. Embodiments of the invention rely on an available serializer/deserializer (serdes) strobe signal that goes HIGH every fixed number of clock cycles. The invention significantly reduces the overall size of a deserializer circuit without compromising the operating speed. For example, the present invention can be advantageously implemented in a small, low cost IC device such as an FPGA.

Figure 2:
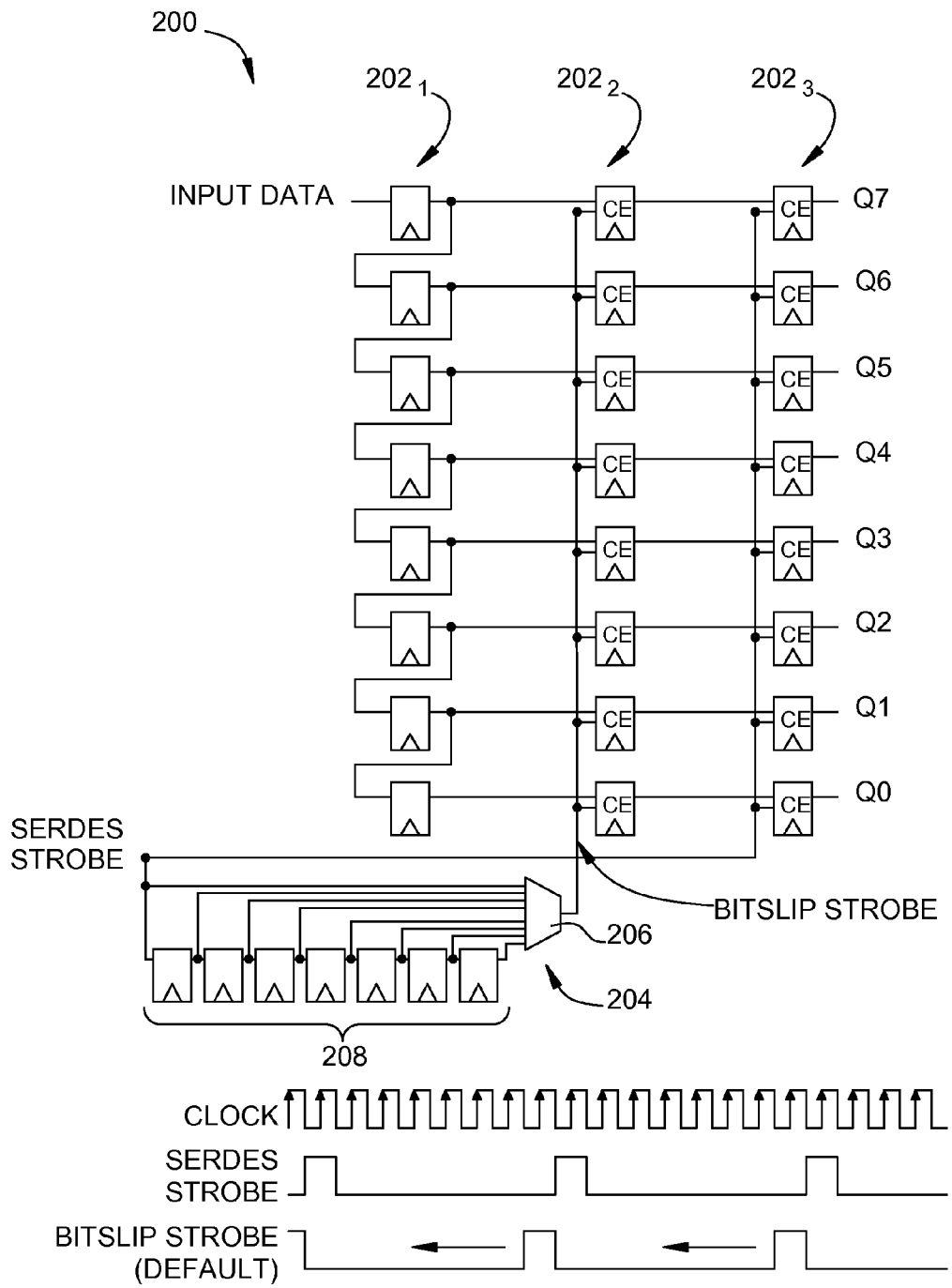
FIG. 2 is a schematic diagram illustrating one embodiment of a deserializer, according to the present invention.

FIG. 2 is a schematic diagram illustrating one embodiment of a deserializer 200, according to the present invention. As illustrated, in one embodiment, the deserializer 200 comprises three register banks: an input register bank $202_1$, an intermediate register bank $202_2$, and an output register bank $202_3$ (hereinafter collectively referred to as "register banks 202"). In the illustrated embodiment, the deserializer is an eight-bit input deserializer; as such, each of the register banks 202 comprises eight flip flops. However, the register banks 202 could comprise any number n of flip flops to make an n-bit input deserializer, without departing from the scope of the present invention. All of the flip flops are clocked with the same clock signal.

In addition, the deserializer 200 comprises a strobe mux 204. The strobe mux 204 comprises an n-to-one multiplexer 206 (e.g., in the illustrated case, an eight-to-one multiplexer), where (n−1) of the inputs to the multiplexer 206 are coupled to the outputs of respective flip flops in a bank 208 of flip flops.

The $n^{th}$ input of the multiplexer 206 is coupled to a serdes strobe signal. The serdes strobe signal is a clock signal that goes HIGH for one cycle in every n clock cycles. For example, if the deserialization ratio is eight-to-one as illustrated, the serdes strobe signal will go HIGH for one cycle in every eight clock cycles. In particular, the serdes strobe signal captures the incoming data stream and outputs the parallel data word to the IC fabric. The serdes strobe signal has a fixed timing relationship relative to the fabric global clock that subsequently uses the output parallel data word. The output of the multiplexer 206 is coupled to the intermediate register bank $202_2$ (i.e., to each flip flop in the intermediate register bank $202_2$).

An input of the first flip flop in the bank 208 of flip flops is also coupled to the serdes strobe signal. The output of the first flip flop is coupled to the input of the second flip flop, and so on, all the way to the $(n-1)^{th}$ flip flop. Each flip flop adds a delay to the serdes strobe signal before outputting the serdes strobe signal to the next flip flop. In addition, the output of each flip flop is also coupled to the multiplexer 206. Thus, the multiplexer 206 selects a clock signal that is the serdes strobe signal or one of (n−1) delayed versions of the serdes strobe signal to drive the intermediate register bank $202_2$. The selected clock signal is referred to as the "bitslip strobe signal." In addition, the serdes strobe signal directly drives the output register bank $202_3$, as illustrated (i.e., the serdes strobe signal is coupled to each flip flop in the output register bank $202_3$).

By driving the clock-enable (CE) of the intermediate register bank $202_2$ to a delayed version of the serdes strobe signal, the order in which the data is captured by the intermediate register bank $202_2$ can be varied, while the output register bank $202_3$ still outputs the data timed to the original serdes strobe signal. By using the bitslip function, a user can change the selection on the multiplexer 206 such that data in the input register bank $202_1$ is captured at a time when all of the bits are in the correct order (e.g., ordered from most significant bit to least significant bit).

The serdes strobe signal is set so that it goes HIGH on a cycle of a lower-speed clock signal. Thus, the serdes strobe signal has a fixed position relative to the lower-speed clock signal. In particular, the serdes strobe signal defines on which edge of the high-speed clock signal the output data changes, so its timing is controlled relative to the active edge of the lower-speed clock signal to maximize the timing margin. This ensures that the data is settled and can be captured in the flip flops of the next register bank. Thus, the deserializer 200 transfers the input data from a high-speed clock domain to a low-speed lock domain. As a default, the bitslip strobe signal is set to be one clock cycle earlier than the serdes strobe signal, but the bitslip strobe signal may be adjusted as necessary.

Figure 1:
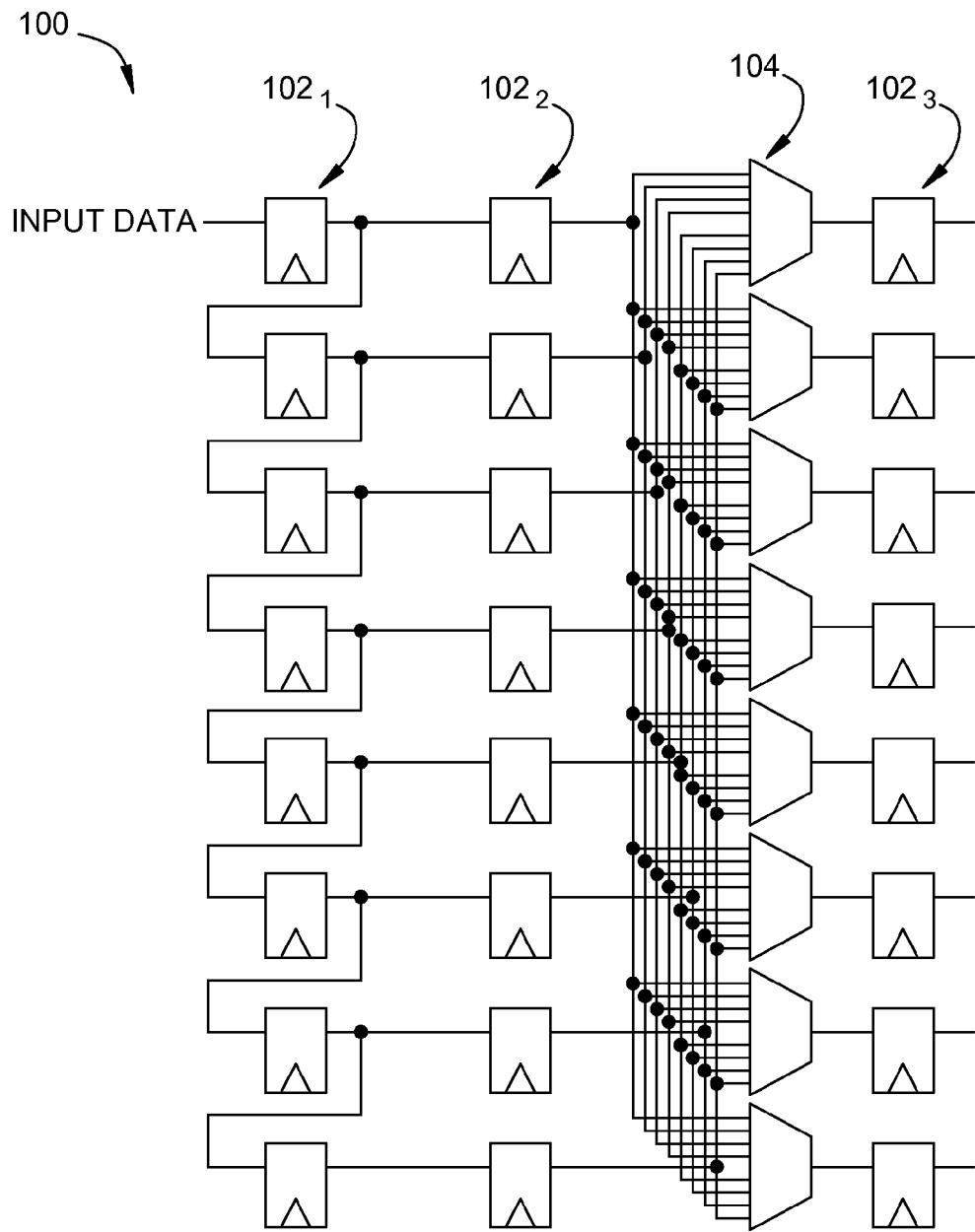
FIG. 1 is a schematic diagram illustrating a conventional eight-bit input deserializer.

The configuration of the deserializer 200 offers many advantages over conventional deserializers that implement bitslip functions. For example, the deserializer 200 is much more scalable. The strobe mux 204, which comprises a single multiplexer 206 and bank 208 of (n−1) flip flops, can accomplish substantially the same result as the n multiplexers illustrated in the conventional deserializer 100 of FIG. 1. Moreover, the (n−1) flip flops have very little loading, whereas the n multiplexers must be large in order to minimize the path delay through them. Thus, the strobe mux 204 also consumes less circuit area, which is at a premium in small IC devices.

The configuration of the intermediate register bank $202_2$ conserves even more circuit area. In conventional deserializers, the flip flops in an equivalent register bank typically must be high-speed and must be capable of driving a large load. The intermediate register bank $202_2$ requires flip flops of limited speed and load capacities, and therefore can be manufactured with relatively small sized devices. This significantly reduces not only the physical sizes of the flip flops, but also reduces the load presented by the flip flops to the clock driver. This provides additional opportunity for area and power savings. In addition, the relatively simple structure of the deserializer 200 allows the layout to compact easily, providing further savings in area over conventional deserializers.

In addition, the present invention may actually achieve higher speeds of operation relative to conventional deserializers. The only significant load in the design of the deserializer 200 is the output of the strobe mux 204. This load, together with the width of the multiplexer 206, sets a limit on the operating frequency that is similar to a conventional deserializer. However, moving the multiplexer 206 out of the data path gives a designer the freedom to insert as many pipeline stages into the muxing structure as needed, with no effect on the latency of the data path. By pipelining in this way, speeds of operation can be achieved that would not otherwise be possible using a conventional deserializer in the available area.

Figure 3:
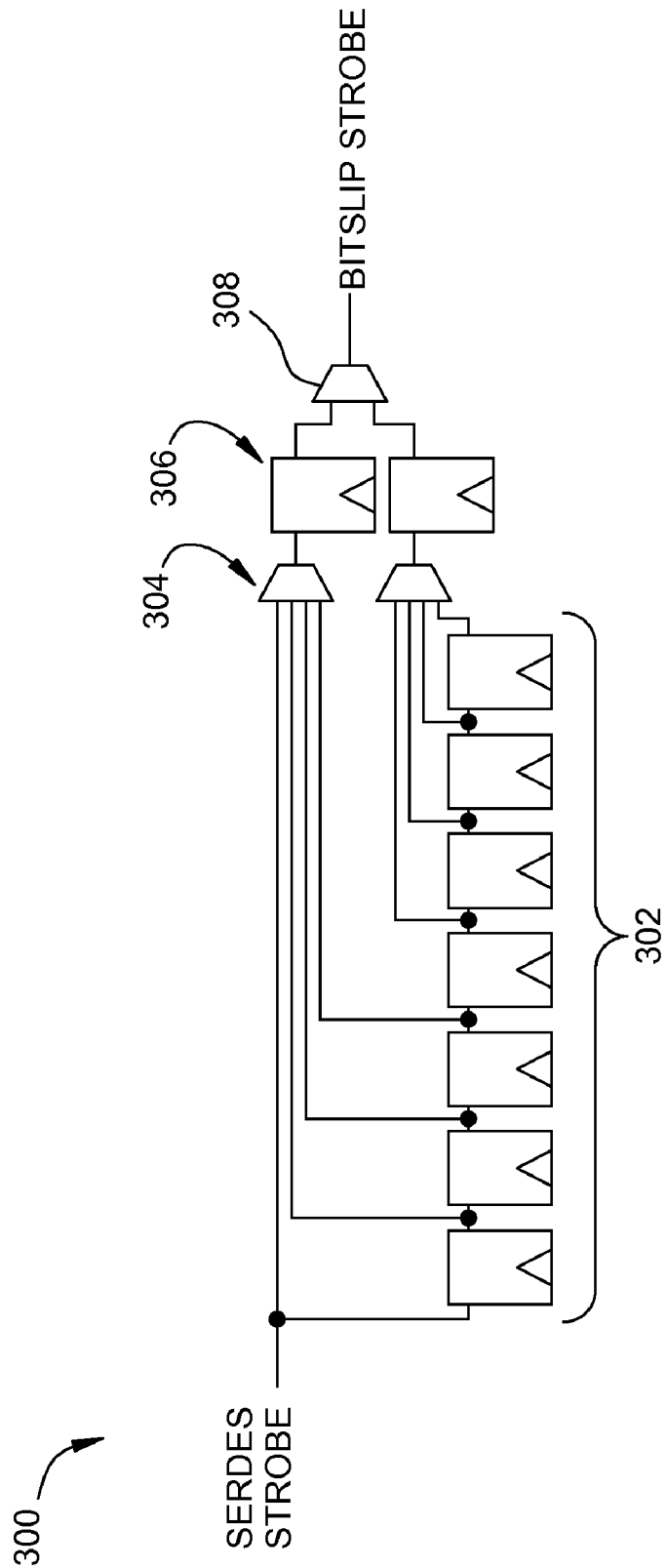
FIG. 3 is a schematic diagram illustrating one embodiment of a strobe mux that has been pipelined to improve operating frequency, according to the present invention.

FIG. 3, for example, is a schematic diagram illustrating one embodiment of a strobe mux 300 that has been pipelined to improve operating frequency, according to the present invention. Specifically, the exemplary strobe mux 300 comprises two pipelining stages. However, the strobe mux 300 can be configured with any number m of pipelining stages without departing from the scope of the present invention.

As illustrated, the strobe mux 300 comprises a first bank 302 of (n−1) flip flops, a bank 304 of two (n/m)-to-one multiplexers, a second bank 306 of m flip flops, and a single m-to-one multiplexer 308. The serdes strobe is coupled to the input of the first flip flop in the first bank 302, as well as to an input of the first (n/m) multiplexer in the bank 304 of multiplexers. As discussed above, the output of the first flip flop in the first bank 302 is coupled to the input of the second flip flop in the first bank 302, and so on, all the way to the $(n-1)^{th}$ flip flop in the first bank 302. Each flip flop in the first bank 302 adds a delay to the serdes strobe signal before outputting the serdes strobe signal to the next flip flop.

In addition, the outputs of the first (n/m)−1 flip flops in the first bank 302 are also coupled to the first (n/m) multiplexer in the bank 304 of multiplexers. The outputs of the second (n/m) flip flops in the first bank 302 are coupled to the second (n/m) multiplexer in the bank 304 of multiplexers. The outputs of each of the (n/m) multiplexers in the bank 304 are coupled to the inputs of respective flip flops in the second bank 306 of flip flops. The flip flops in the second bank 306 delay the incoming strobe signals by one additional cycle. The outputs of the flip flops in the second bank 306 are coupled to m respective inputs of the single m-to-one multiplexer 308, which outputs the bitslip strobe signal as described above.

By pipelining in the manner illustrated in FIG. 3, the bitslip strobe signal can be delayed by one additional cycle. The strobe mux 300 requires m additional flip flops (i.e., the second bank 306 of flip flops) relative to the strobe mux 204 illustrated in FIG. 2, but this cost is independent of the serdes ratio. Depending on how much of an increase in performance is desired, the strobe mux 300 may also reduce the speed requirements, and, therefore, the size of the m-to-one multiplexer 308. This mitigates the increased cost (in terms of size) of the m additional flip flops.

Figure 4:
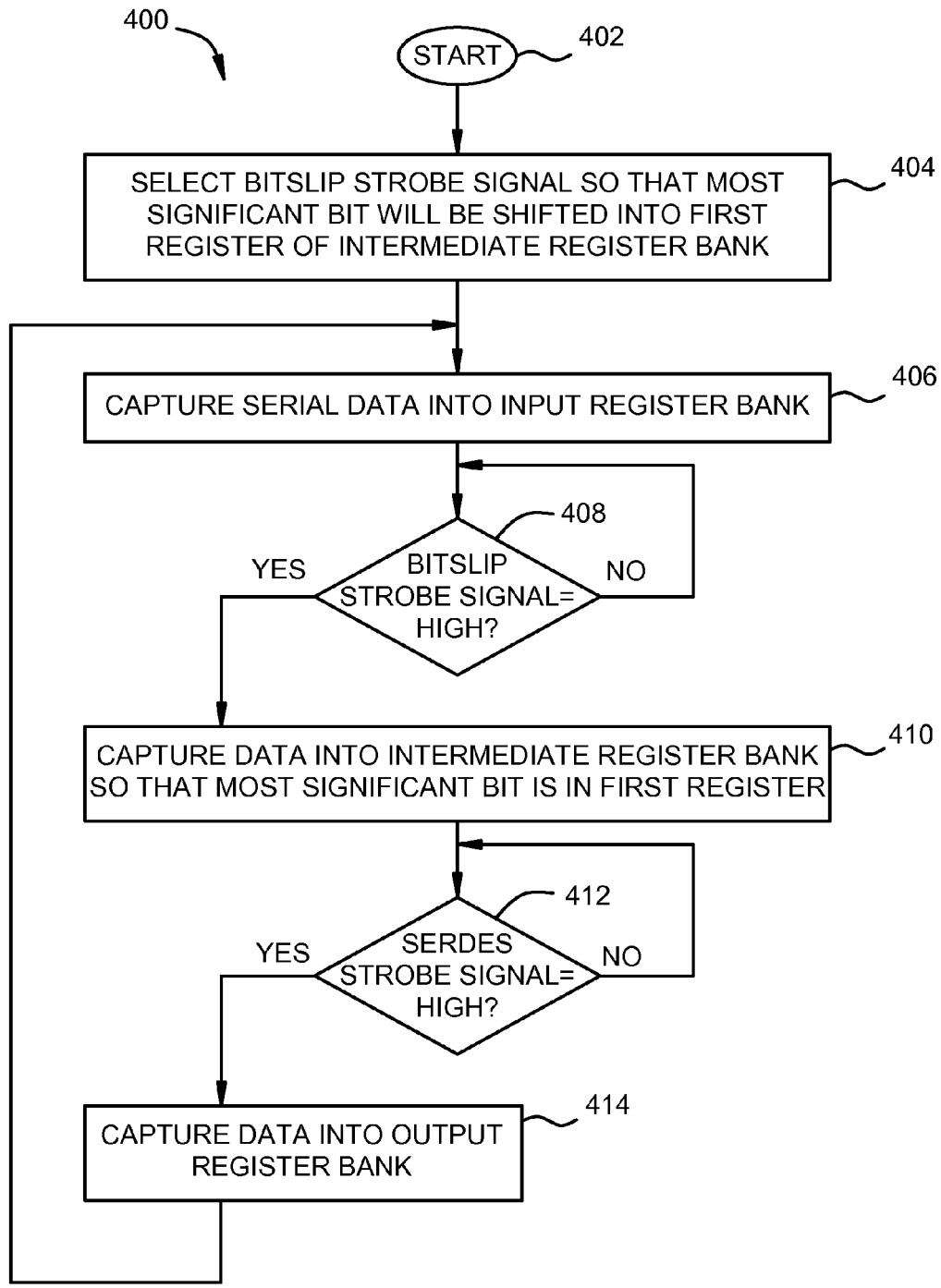
FIG. 4 is a flow diagram illustrating one embodiment of a method for shifting the bits of a wide data word, according to the present invention.

FIG. 4 is a flow diagram illustrating one embodiment of a method 400 for shifting the bits of a data word, according to the present invention. The method 400 may be implemented, for example, in the deserializer 200 illustrated in FIG. 2. As such, reference is made in the discussion of FIG. 4 to various elements of the deserializer 200. However, it will be appreciated that the method 400 is not necessarily limited to implementation with a deserializer having the exact configuration of the deserializer 200.

The method 400 is initialized in step 402 and proceeds to step 404, where the deserializer 200 selects a bitslip strobe signal so that the most significant bit will be shifted into the first register or flip flop of the intermediate register bank $202_2$. Specifically, the select line of the multiplexer 206 is set to select the appropriate input from the n input signals.

In one embodiment, the appropriate input signal is selected by first running a training pattern through the deserializer 200. For example, the training pattern may specify that only the most significant bit of an input data word be set to HIGH (e.g., 1), while all other bits be set to LOW (e.g., 0). By observing which register in the output register bank $202_3$ captures the HIGH bit, one can determine by how many cycles to shift the bits. The select line of the multiplexer 206 can then be set to select a bitslip strobe signal that is one or more cycles earlier than the serdes strobe signal. In one embodiment, the bitslip strobe signal is adjusted one cycle at a time until the HIGH bit is captured in the first register (i.e., the register coupled to output Q7 in FIG. 2) of the output register bank $202_3$.

Once the bitslip strobe signal has been selected, the input register bank $202_1$ captures the serial data (i.e., the input wide data word) in step 406. In step 408, the deserializer 200 determines whether the bitslip strobe signal is HIGH. If the bitslip strobe signal is not HIGH, the deserializer 200 returns to step 408 and waits for the bitslip strobe signal to go HIGH. It is noted that the capture of the serial data (i.e., in steps 406 and 410) does not stop and loop until the bitslip strobe signal is HIGH. Rather, the capture of the serial data is continuous. The serial data is merely transferred from the input register bank $202_1$ to the intermediate register bank $202_2$ when the bitslip strobe signal is HIGH.

Once the bitslip strobe signal does go HIGH in step 408, the intermediate register bank $202_2$ captures the data from the input register bank $202_1$ in step 410. Specifically, the intermediate register bank $202_2$ captures the data so that the most significant bit is captured into the first register of the intermediate register bank $202_2$, and the rest of the bits are ordered down to the least significant bit captured in the last register of the intermediate register bank $202_2$. Thus, the data may be re-ordered into an aligned order as it is moved from the input register bank $202_1$ to the intermediate register bank $202_2$.

In step 412, the deserializer 200 determines whether the serdes strobe signal is HIGH. If the serdes strobe signal is not HIGH, the deserializer 200 returns to step 412 and waits for the serdes strobe signal to go HIGH.

Once the serdes strobe signal does go HIGH in step 412, the output register bank $202_3$ captures the data from the intermediate register bank $202_2$ in step 414. The method 400 then returns to step 406, so that the input register bank $202_1$ can capture the next input data word, and the method 400 repeats as described above.

Figure 5:
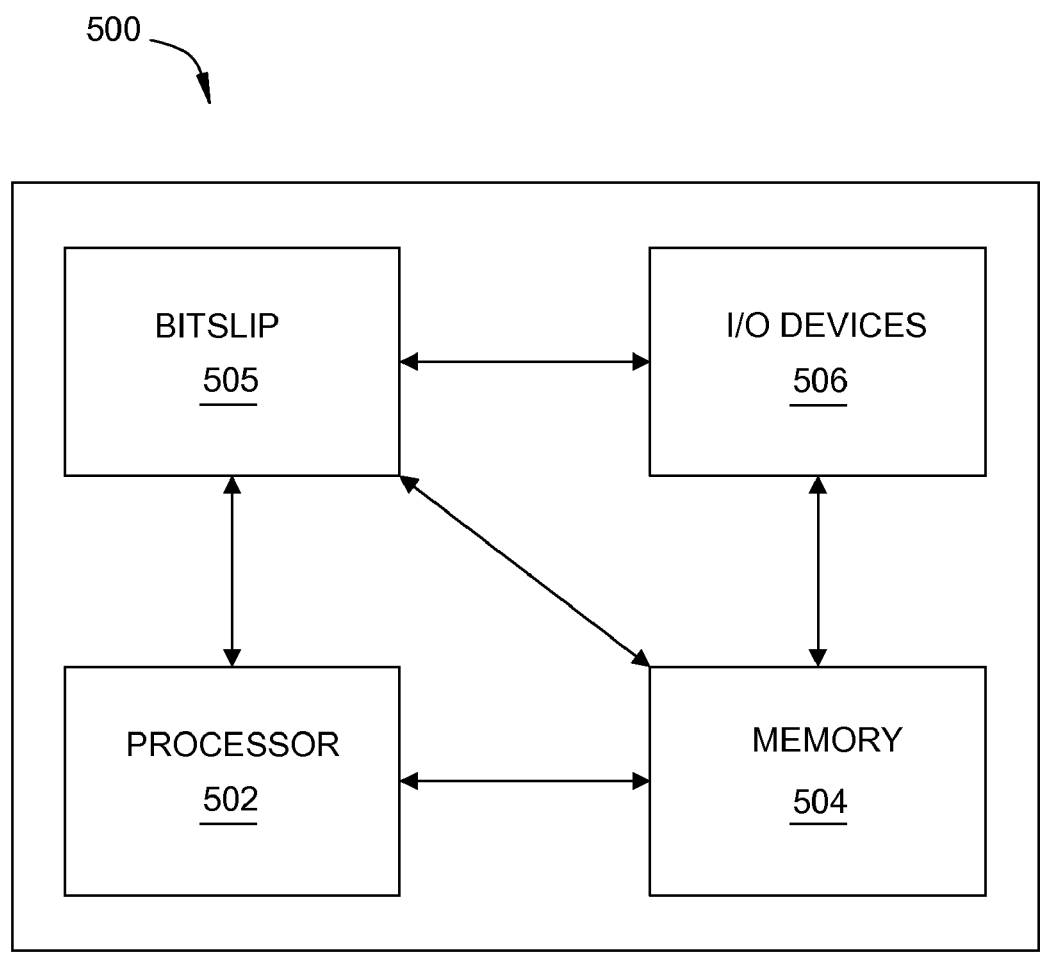
FIG. 5 illustrates a high level block diagram of a general purpose computer or a computing device suitable for use in performing the functions described herein.

FIG. 5 depicts a high level block diagram of a general purpose computer or a computing device suitable for use in performing some or all of the functions described herein. As depicted in FIG. 5, the system 500 comprises a processor element or processing elements 502 (e.g., a central processing unit (CPU)), a memory 504 (e.g., a random access memory (RAM) and/or a read only memory (ROM)), a bitslip module 505 for shifting the bits of a wide data word, and various input/output devices 506 (e.g., storage devices, including but not limited to, a memory device, a tape drive, a floppy drive, a hard disk drive or a compact disk drive, a receiver, a transmitter, a speaker, a display, a speech synthesizer, an output port, and a user input device (such as a keyboard, a keypad, a mouse, and the like)).

Embodiments of the present invention can be implemented in software and/or in a combination of software and hardware (e.g., using application specific integrated circuits (ASIC), a general purpose computer, one or more portions of a PLD, or any other hardware equivalents such as microprocessors). In one embodiment, one or more steps of the present module or process for shifting the bits of a data word can be loaded into memory 504 and executed by processor 502 to implement the functions as discussed above. As such, the present module or process 505 for shifting the bits of a wide data word of embodiments of the present invention can be stored on a non-transitory computer readable storage medium (e.g., RAM memory, magnetic or optical drive or diskette and the like).

It should be noted that although not explicitly specified, one or more steps of the methods described herein may include a storing, displaying and/or outputting step as required for a particular application. In other words, any data, records, fields, and/or intermediate results discussed in the methods can be stored, displayed, and/or outputted to another device as required for a particular application. Furthermore, steps or blocks in the accompanying Figures that recite a determining operation or involve a decision, do not necessarily require that both branches of the determining operation be practiced. In other words, one of the branches of the determining operation can be deemed as an optional step.

While the foregoing describes exemplary embodiments in accordance with one or more aspects of the present invention, other and further embodiments in accordance with the one or more aspects of the present invention may be devised without departing from the scope thereof, which is determined by the claims that follow and equivalents thereof. Claims listing steps do not imply any order of the steps. Trademarks are the property of their respective owners.

What is claimed is:

1. A deserializer, comprising:
   an input register bank for capturing serial data comprising n bits;
   an intermediate register bank, where an input of the intermediate register bank is coupled to an output of the input register bank; and
   a strobe mux coupled to an input of the intermediate register bank,
   wherein the strobe mux comprises a single multiplexer configured to receive a plurality of signals including a serializer/deserializer (serdes) strobe signal and at least one delayed version of the serdes strobe signal and to select from the plurality of signals a bitslip strobe signal that controls an order in which the n bits of the serial data are captured in the intermediate register bank.

2. The deserializer of claim 1, further comprising:
   an output register bank, wherein an input of the output register bank is coupled to an output of the intermediate register bank.

3. The deserializer of claim 2, wherein the output register bank is driven by the serdes strobe signal.

4. The deserializer of claim 1, wherein the single multiplexer comprises an n-to-one multiplexer.

5. The deserializer of claim 4, wherein the strobe mux further comprises:
   (n−1) flip flops, where an output of each of the (n−1) flip flops is coupled to an input of the single multiplexer.

6. The deserializer of claim 5, wherein each of the (n−1) flip flops is configured to output one of the at least one delayed version of the serdes strobe signal.

7. The deserializer of claim 6, wherein the single multiplexer receives the serdes strobe signal on one input.

8. The deserializer of claim 1, wherein the strobe mux further comprises m pipelining stages.

9. The deserializer of claim 8, wherein the m pipelining stages comprise:
a first bank of (n−1) flip flops;
a bank of m (n/m)-to-one multiplexers, where an output of each of the (n−1) flip flops is coupled to an input of one of the m (n/m)-to-one multiplexers; and
a second bank of m flip flops, where an output of each of the m (n/m)-to-one multiplexers is coupled to one of the m flip flops,
wherein an output of each of the m flip flops is coupled to an input of the single multiplexer, and wherein the single multiplexer is an m-to-one multiplexer.

10. The deserializer of claim 9, wherein each of the (n−1) flip flops is configured to output a delayed version of the serdes strobe signal.

11. The deserializer of claim 10, wherein the one of the m (n/m)-to-one multiplexers receives the serdes strobe signal on one input.

12. The deserializer of claim 10, wherein each of the m flop flops is configured to output a further delayed version of the serdes strobe signal.

13. A method for shifting bits of a data word, the method comprising:
capturing the bits into an input register bank of a deserializer; and
shifting the bits from the input register bank to an intermediate register bank,
wherein the shifting is performed in accordance with a bitslip strobe signal that controls an order in which the bits are captured in the intermediate register bank, and
wherein the bitslip strobe signal is selected from a plurality of signals including: a serializer/deserializer (serdes) strobe signal and at least one delayed version of the serdes strobe signal.

14. The method of claim 13, further comprising:
shifting the bits from the intermediate register bank to an output register bank.

15. The method of claim 14, wherein the bits are shifted to the output register bank in accordance with the serdes strobe signal.

16. The method of claim 13, wherein the bitslip strobe signal is selected such that a most significant bit of the bits is shifted to a first register in the intermediate register bank.

17. A non-transitory computer-readable storage medium having stored thereon a plurality of instructions, the plurality of instructions including instructions which, when executed by a processor, cause the processor to perform steps of a method for shifting bits of a data word, comprising:
capturing the bits into an input register bank of a deserializer; and
shifting the bits from the input register bank to an intermediate register bank,
wherein the shifting is performed in accordance with a bitslip strobe signal that controls an order in which the bits are captured in the intermediate register bank, and
wherein the bitslip strobe signal is selected from a plurality of signals including: a serializer/deserializer (serdes) strobe signal and at least one delayed version of the serdes strobe signal.

18. The non-transitory computer-readable storage medium of claim 17, wherein the bitslip strobe signal is selected such that a most significant bit of the bits is shifted to a first register in the intermediate register bank.

19. The non-transitory computer-readable storage medium of claim 17, further comprising:
shifting the bits from the intermediate register bank to an output register bank in accordance with the serdes strobe signal.

* * * * *